(12) United States Patent
Kaptanoglu et al.

(10) Patent No.: US 7,330,052 B2
(45) Date of Patent: Feb. 12, 2008

(54) AREA EFFICIENT FRACTUREABLE LOGIC ELEMENTS

(75) Inventors: Sinan Kaptanoglu, Belmont, CA (US); Bruce B. Pedersen, Sunnyvale, CA (US); James G. Schleicher, Los Gatos, CA (US); Jinyong Yuan, Cupertino, CA (US); Michael D. Hutton, Mountain View, CA (US); David Lewis, Toronto (CA)

(73) Assignee: Altera Corporation, San Jose, CA (US)

( * ) Notice: Subject to any disclaimer, the term of this patent is extended or adjusted under 35 U.S.C. 154(b) by 119 days.

(21) Appl. No.: 11/234,538

(22) Filed: Sep. 22, 2005

(65) Prior Publication Data

US 2007/0063732 A1 Mar. 22, 2007

(51) Int. Cl.
*G06F 7/38* (2006.01)
*H03K 19/177* (2006.01)

(52) U.S. Cl. .............................. 326/40; 326/41; 326/47
(58) Field of Classification Search ............ 326/37–41, 326/47
See application file for complete search history.

(56) References Cited

U.S. PATENT DOCUMENTS

| | | | |
|---|---|---|---|
| 6,747,480 B1 | 6/2004 | Kaptanoglu et al. | |
| 6,798,240 B1 | 9/2004 | Pedersen | |
| 6,888,373 B2 * | 5/2005 | Kaptanoglu et al. | 326/40 |
| 7,030,650 B1 * | 4/2006 | Kaptanoglu et al. | 326/40 |
| 7,167,022 B1 * | 1/2007 | Schleicher et al. | 326/41 |
| 7,176,716 B2 * | 2/2007 | Madurawe | 326/38 |
| 7,185,035 B1 * | 2/2007 | Lewis et al. | 708/235 |
| 2004/0155676 A1 * | 8/2004 | Kaptanoglu et al. | 326/38 |

FOREIGN PATENT DOCUMENTS

EP    1 445 864 A2    8/2004

OTHER PUBLICATIONS

U.S. Appl. No. 10/810,117, filed Mar. 25, 2004.
Altera Corporation, Stratix II Device Handbook, vol. 1, Chapter 2, 104 pages, Jul. 2005.
European Search Report from Application No. 06019794.4 dated Dec. 21, 2006.

* cited by examiner

*Primary Examiner*—Rexford Barnie
*Assistant Examiner*—Jason Crawford
(74) *Attorney, Agent, or Firm*—Beyer Weaver LLP

(57) ABSTRACT

A fracturable logic element includes a first, second, third, and fourth two-input lookup tables (2-LUTs). Each 2-LUT includes four memory elements. Each memory element is configured to hold one data bit. The fracturable logic element also includes a set of six inputs and a control circuit configured to operate in a first mode and a second mode. When the control circuit operates in the first mode, a first combinatorial output is generated using four of the set of six inputs and the first, second, third, and fourth 2-LUTs. When the control circuit operates in the second mode, a second combinatorial output is generated using a first subset of three of the set of six inputs and the first and second 2-LUTs. Additionally, when the control circuit operates in the second mode, a third combinatorial output is generated using a second subset of three of the set of six inputs and the third and fourth 2-LUTs, the first and second subsets being non-intersecting subsets of the set of six inputs.

23 Claims, 9 Drawing Sheets

AREA EFFICIENT FRACTUREABLE LOGIC ELEMENTS

BACKGROUND

1. Field

The present application relates to logic elements for use with programmable logic devices or other similar devices.

2. Related Art

Programmable logic devices ("PLDs") (also sometimes referred to as CPLDs, PALs, PLAs, FPLAs, EPLDs, EEPLDs, LCAs, FPGAs, or by other names), are well-known integrated circuits that provide the advantages of fixed integrated circuits with the flexibility of custom integrated circuits. Such devices are well known in the art and typically provide an "off the shelf" device having at least a portion that can be electrically programmed to meet a user's specific needs. Application specific integrated circuits ("ASICs") have traditionally been fixed integrated circuits, however, it is possible to provide an ASIC that has a portion or portions that are programmable; thus, it is possible for an integrated circuit device to have qualities of both an ASIC and a PLD. The term PLD as used herein will be considered broad enough to include such devices.

PLDs typically include blocks of logic elements, which are sometimes referred to as logic array blocks ("LABs") or "configurable logic blocks" ("CLBs"). Logic elements ("LEs"), which are also referred to by other names such as "logic circuits" or "logic cells", may include a look-up table ("LUT"), product term, carry-out chain, register, and other elements.

Logic elements, including LUT-based logic elements, typically include configurable elements holding configuration data that determine the particular function or functions carried out by the logic element. A typical LUT circuit may include RAM bits that hold data (a "1" or "0"). However, other types of configurable elements may be used. Some examples may include static, magnetic, ferro-electric or dynamic random access memory, electrically erasable read-only memory, flash, fuse, and anti-fuse programmable connections. The programming of configuration elements could also be implemented through mask programming during fabrication of the device. While mask programming may have disadvantages relative to some of the field programmable options already listed, it may be useful in certain high volume applications. For purposes herein, the generic term "memory element" will be used to refer to any programmable element that may be configured to determine functions implemented by a PLD.

As discussed above, PLDs are commonly constructed using a lookup table (LUT) as the basic logic element. For example, a K-input lookup table (K-LUT) typically includes $2^K$ programmable memory elements, and a 2K to 1 multiplexer tree, selecting one of the storage elements under the control of the K select inputs to the multiplexer. These K inputs can be considered to be the inputs to a K-input logic function which can implement any particular required logic function by setting the contents of the memory elements to the appropriate values.

There is a tradeoff between cost and speed of a logic circuit constructed with LUTs. Typically the cost of each LUT grows exponentially with the choice of K, but the number of LUTs required to build a logic circuit decreases more slowly with larger values of K. However, the number of LUTs that are in series for a larger value of K will be reduced, making the logic circuit faster. For example, with K=4, sixteen memory elements and a 16:1 multiplexer are required to build a single LUT, and for K=6, sixty-four memory elements and a 64:1 multiplexer are required. A given logic circuit might require one-thousand 4-LUTs, but only eight-hundred 6-LUTs. Under these assumptions, more hardware is required to construct the 6-LUT logic elements because the reduced number of LUTs is insufficient to compensate for the larger complexity of each LUT. However, the increased hardware requirements for the 6-LUT circuitry are offset by a reduction in the delay. The longest path through a logic circuit might be ten 4-LUTs versus eight 6-LUTs. Thus the 6-LUT version of the circuit might be larger, but faster. Further, the 6-LUT circuit would likely require less programmable routing in a PLD, offsetting some of its higher cost.

One reason for the lack of efficiency of larger LUTs is that not all logic functions will use all K inputs. For the example described above, the eight-hundred 6-LUTs might actually include three-hundred 6-input functions, three-hundred 5-input functions, one-hundred 4-input functions, and one-hundred 3-input functions. Thus, the LE based on 6-LUTs is only being used to its fullest extent in three-hundred out of eight-hundred instances.

Thus, there is a need for a logic element with progammable structures that can be configured to implement a relatively large LUT or a multiplicity of smaller LUTs.

SUMMARY

In one exemplary embodiment, a fracturable logic element includes a first, second, third, and fourth two-input lookup tables (2-LUTs). Each 2-LUT includes four memory elements. Each memory element is configured to hold one data bit. The fracturable logic element also includes a set of six inputs and a control circuit configured to operate in a first mode and a second mode. When the control circuit operates in the first mode, a first combinatorial output is generated using four of the set of six inputs and the first, second, third, and fourth 2-LUTs. When the control circuit operates in the second mode, a second combinatorial output is generated using a first subset of three of the set of six inputs and the first and second 2-LUTS. Additionally, when the control circuit operates in the second mode, a third combinatorial output is generated using a second subset of three of the set of six inputs and the third and fourth 2-LUTs, the first and second subsets being non-intersecting subsets of the set of six inputs.

DETAILED DESCRIPTION

Figure 1:
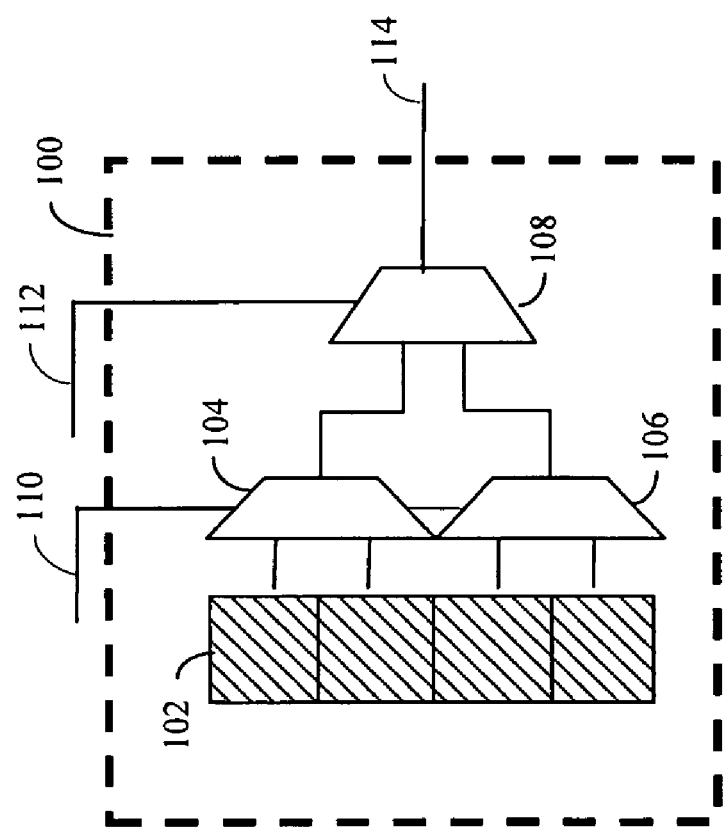
FIG. 1 is a schematic of an exemplary two-input lookup table (2-LUT)

With reference to FIG. 1, an exemplary two-input lookup table (2-LUT) 100 is depicted. 2-LUT 100 includes memory elements 102 connected to 2:1 multiplexers 104, 106. In particular, each memory element 102 can hold one data bit (i.e., 1 or 0), and each is coupled to provide that bit to an input of multiplexers 104, 106. As depicted in FIG. 1, the control inputs of multiplexers 104, 106 are connected to input 110. The outputs of multiplexers 104, 106 are connected to 2:1 multiplexer 108. The control input of multiplexer 108 is connected to input 112. Thus, inputs 110, 112 can be used to selected any one of memory element 102 as an output 114 of 2-LUT 100.

Figure 2:
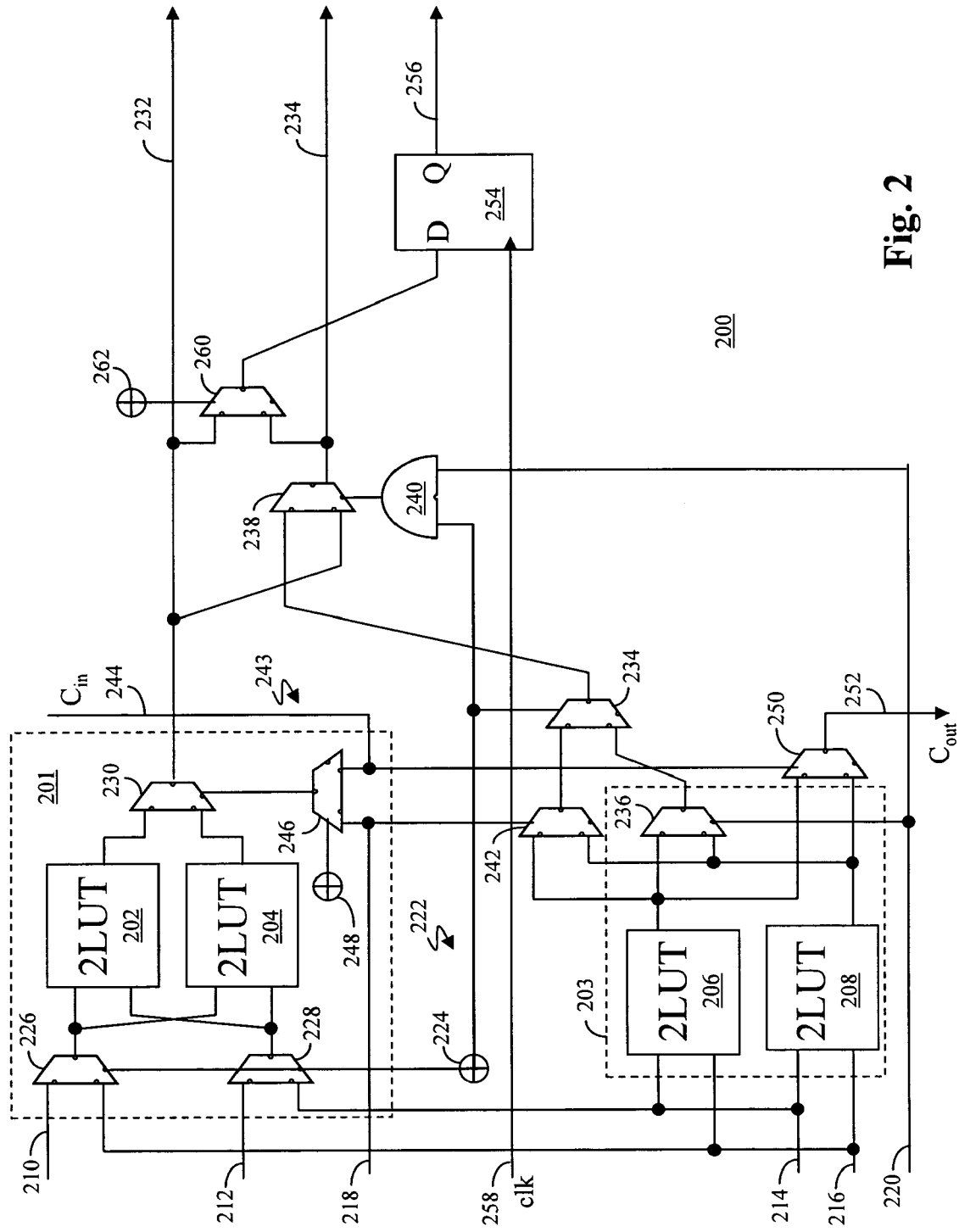
FIG. 2 is a schematic of an exemplary fracturable logic element.

With reference to FIG. 2, a first exemplary embodiment of a fracturable logic element 200 is depicted. Logic element 200 includes four 2-LUTs 202, 204, 206, and 208 and a set of six inputs 210, 212, 214, 216, 218, and 220. Each 2-LUT 202, 204, 206, and 208 includes four memory elements. Thus, logic element 200 includes a total of 16 memory elements, which are also referred to as its LUT mask. For addition descriptions of fractuable logic elements, see U.S. patent application Ser. No. 10/364,310, titled FRACTURABLE LOOKUP TABLE AND LOGIC ELEMENT, filed on Feb. 10, 2003, which is incorporated herein by reference in its entirety.

Logic element 200 includes a control circuit 222 that operates in a first mode and a second mode. In the first mode of control circuit 222, logic element 200 operates as a single 4-LUT, where four of the set of six inputs are used and two of the six inputs are not used. In the second mode of control circuit 222, logic element 200 operates as two 3-LUTs (i.e., a first 3-LUT 201 and a second 3-LUT 203), where a first subset of the six inputs are used for first 3-LUT 201 and a second subset of the six inputs are used for second 3-LUT 203, and where the inputs in the first and second subsets are distinct.

In particular, as depicted in FIG. 2, control circuit 222 includes a control bit 224 connected to the control inputs of multiplexers 226, 228. Inputs 210, 216 are connected to multiplexer 226. Inputs 212, 214 are connected to multiplexer 228. The outputs of multiplexers 226, 228 are connected to the inputs of 2-LUTs 202, 204. The outputs of 2-LUTs 202, 204 are connected to the inputs of multiplexer 230. Inputs 214, 216 are also connected to the inputs of 2-LUTs 206, 208. The outputs of 2-LUTs 206, 208 are connected to the inputs of multiplexer 242. Input 218 is connected to the control input of multiplexer 230 through multiplexer 246. Input 218 is also connected to the control input of multiplexer 242. The output of multiplexer 242 is connected to an input of multiplexer 238 through multiplexer 234. The output of multiplexer 230 is connected to the other input of multiplexer 238. Input 220 is connected to the control input of multiplexer 238 through logic gate 240.

Thus, when control circuit 222 operates in the first mode, control bit 224 controls multiplexers 226, 228 to select inputs 214, 216 as the outputs of multiplexers 226, 228 rather than inputs 210, 212. Thus, inputs 214, 216 are used as inputs of 2-LUTs 202, 204 as well as 2-LUTs 206, 208. Input 218 controls multiplexers 230, 242 to select among the outputs of 2-LUTs 202, 204, 206, and 208. Control bit 224 also controls multiplexer 234 to select the output of multiplexer 242 as the output of multiplexer 234. Input 220 controls multiplexer 238 through logic gate 240 to select between the output of multiplexer 230 and multiplexer 234. Thus, output line 234 outputs the combinatorial output of the four inputs 214, 216, 218, and 220.

When control circuit 222 operates in the second mode, control bit 224 controls multiplexers 226, 228 to select inputs 210, 212 as the outputs of multiplexers 226, 228 rather than inputs 214, 216. Thus, inputs 210, 212 are used as inputs of 2-LUTs 202, 204. Input 218 controls multiplexer 230 through multiplexer 246 to select between the outputs of 2-LUTs 202, 204. Thus, output line 232 outputs the combinatorial output of the three inputs 210, 212, and 218.

Additionally, when control circuit 222 operates in the second mode, inputs 214, 216 are used as inputs to 2-LUTs 206, 208. Input 220 controls multiplexer 236 to select between the outputs of 2-LUTs 206, 208. Control bit 224 selects the output of multiplexer 236 as the output of multiplexer 234. Control bit 224 also controls multiplexer 238 through logic gate 240 to select the output of multiplexer 234 as the output of multiplexer 238. Thus, output line 234 outputs the combinatorial output of the three inputs 214, 216, and 220.

In the present exemplary embodiment, logic element 200 includes an arithmetic circuit 243 to implement one-bit arithmetic. As depicted in FIG. 2, arithmetic circuit 243 includes a carry-chain input ($C_{in}$) 244, which is generated by a previous logic element, connected to an input of multiplexer 246. A control bit 248 controls multiplexer 246 to select between input 218 and carry-chain input 244. The output of multiplexer 246 controls multiplexer 230. Thus, in an arithmetic mode, multiplexer 230 can produce an arithmetic sum based on inputs to 2-LUTs 202, 204 and carry-chain input 244. As also depicted in FIG. 2, carry-chain input 244 controls multiplexer 250 to generate a carry-chain output ($C_{out}$) 252, which feeds a subsequent logic element.

In the present exemplary embodiment, logic element 200 includes a flip-flop 254 to produce a registered output on output line 256. As depicted in FIG. 2, flip-flop 254 receives a clock signal 258, and the data input of flip-flop 254 is connected to the output of multiplexer 260. A control bit 262 controls multiplexer 260 to select between the outputs of multiplexer 230, which outputs the combinatorial output of the three inputs 210, 212, 218, and multiplexer 238, which outputs the combinatory output of the four inputs 214, 216, 218, and 220. Thus, output line 256 outputs the registered output of either three inputs 210, 212, and 218 or four inputs 214, 216, 218, and 220.

Figure 3:
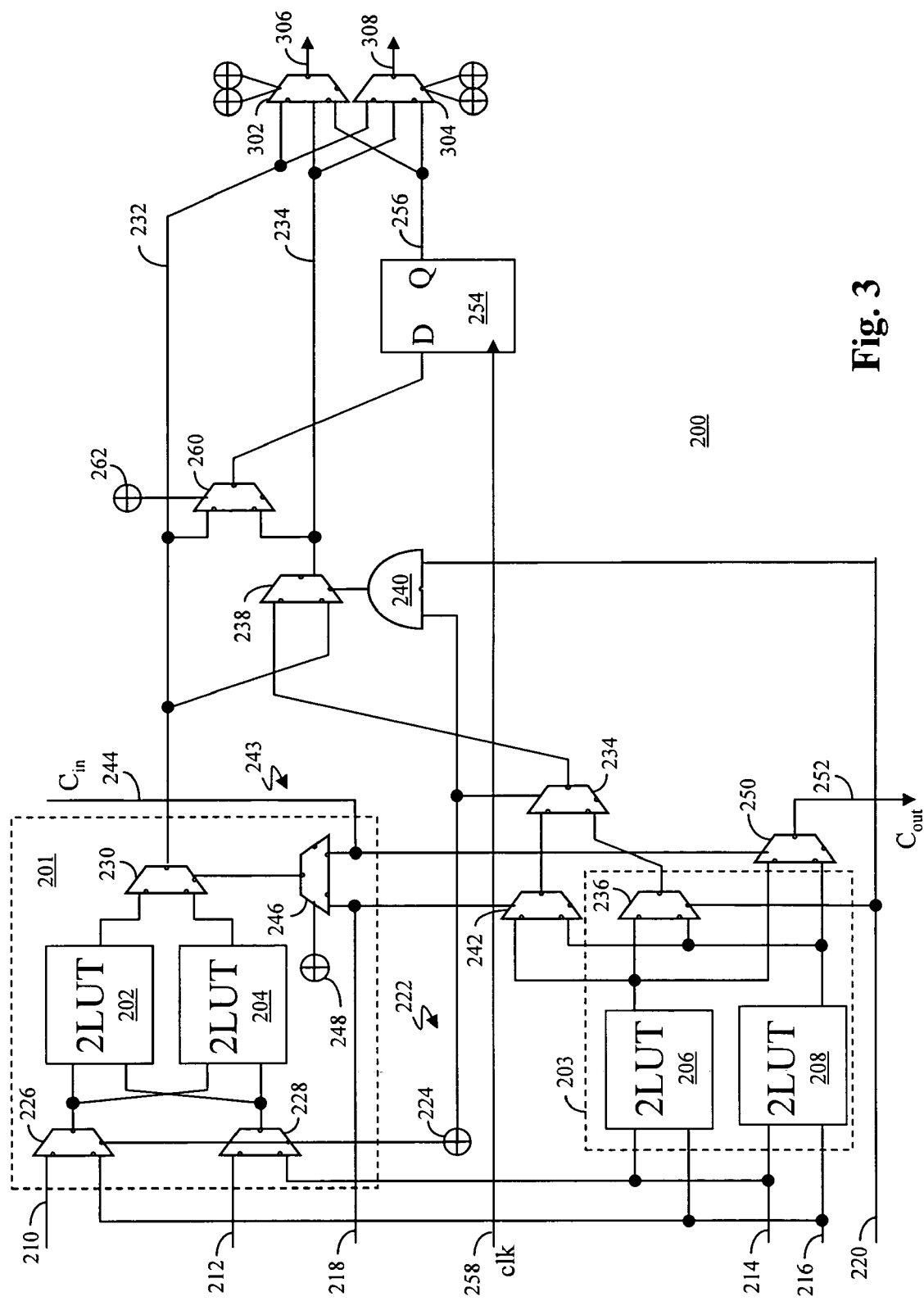
FIG. 3 is a schematic of another exemplary fracturable logic element.

With reference to FIG. 3, a second exemplary embodiment of logic element 200 is depicted. The second exemplary embodiment of logic element 200 includes the features of the first exemplary embodiment with the addition of 3:1 multiplexers 302, 304 to reduce the number of output lines from three to two, which reduces the number of drivers needed. As depicted in FIG. 3, multiplexers 302, 304 are each connected to output lines 232, 234, and 256. Thus, outputs on output lines 306, 308 from multiplexers 302, 304, respectively, can be selected among output lines 232, 234, and 256.

Figure 4:
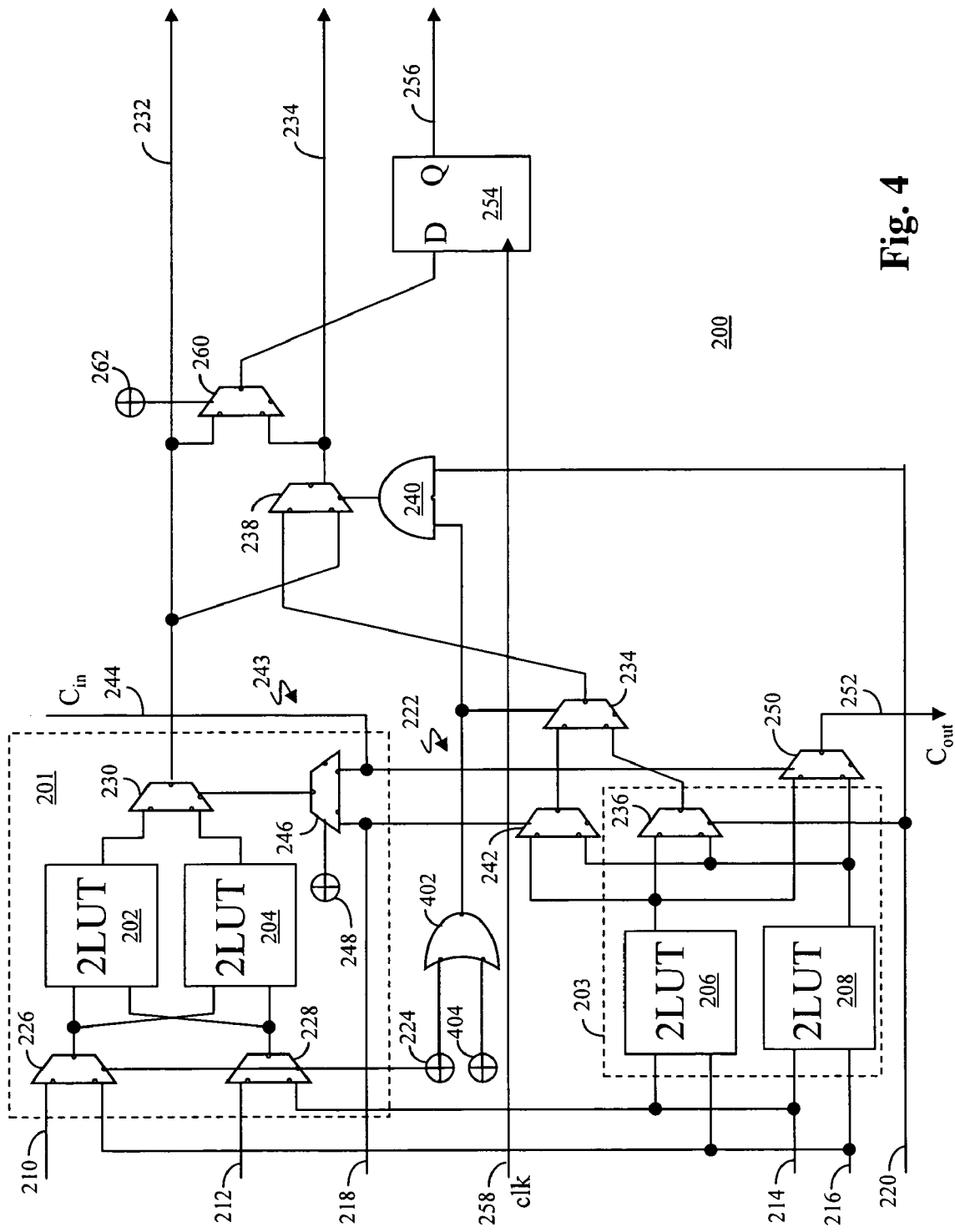
FIG. 4 is a schematic of another exemplary fracturable logic element.

With reference to FIG. 4, a third exemplary embodiment of logic element 200 is depicted. The third exemplary embodiment of logic element 200 includes the features of the first exemplary embodiment with the addition of a logic gate 402 to implement a 4:1 multiplexing mode. As depicted in FIG. 4, logic gate 402 is an OR gate with inputs connected to control bits 224, 404 and an output connected to an input of logic gate 240 and the control input of multiplexer 234.

To operate in the 4:1 multiplexing mode, control bit 224 controls multiplexers 226, 228 to select inputs 210, 212.

Input 218 controls multiplexer 230 through multiplexer 246 to select between inputs 210, 212. Input 218 also controls multiplexer 242 to select between inputs 214, 216. Control bit 404 is set appropriately to control multiplexer 234 to select the output of multiplexer 242 as the output to multiplexer 234 and to force input 220 to control multiplexer 238 through logic gate 240. Thus, input 220 controls multiplexer 238 to select between the outputs of multiplexer 230 (inputs 210, 212) and multiplexer 234 (inputs 214, 216). Note that the order of the multiplexors (e.g., multiplexer 226) can be modified so that this controlling behavior is possible while maintaining the dual usage of the SRAM configuration bits.

Figure 5:
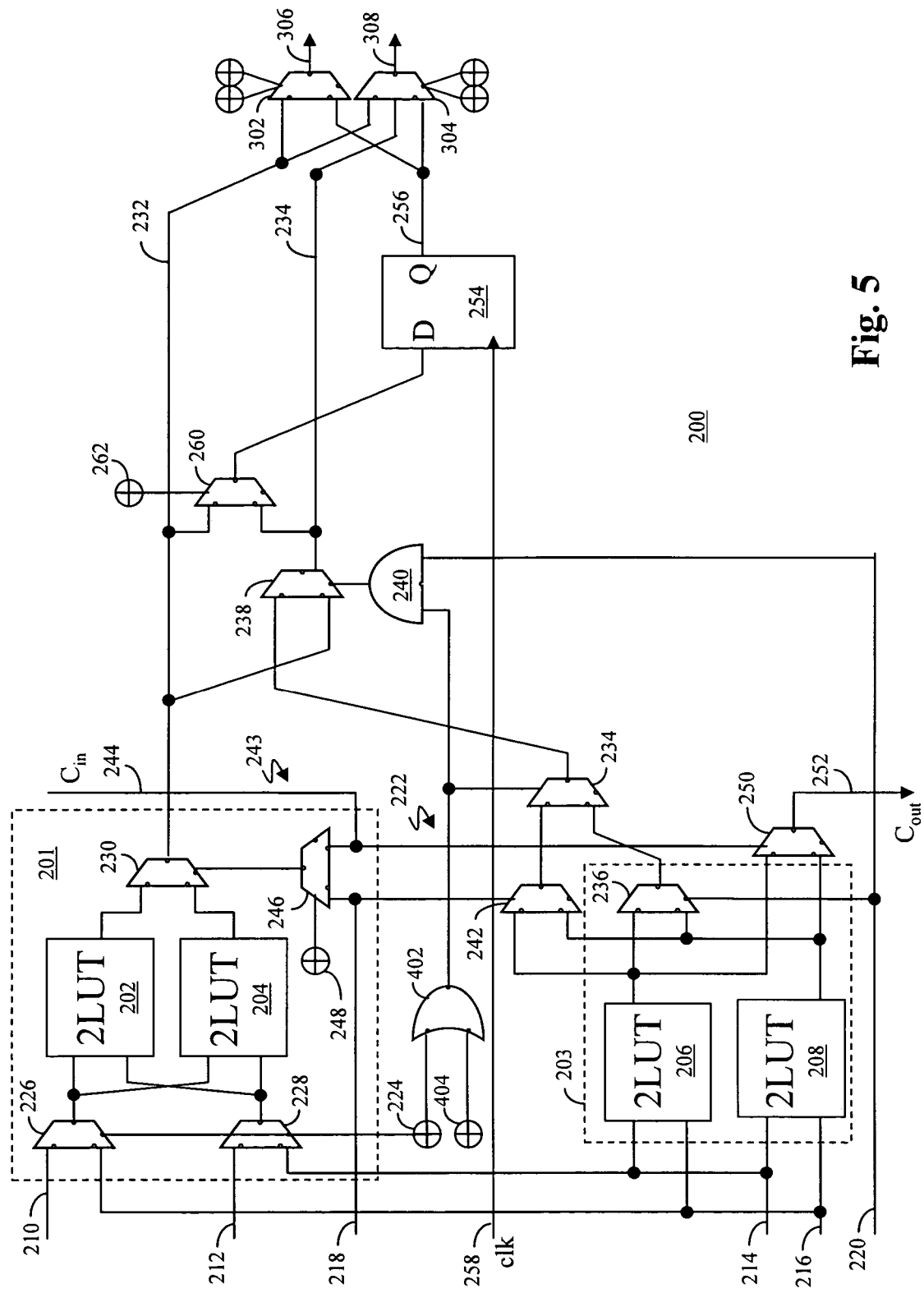
FIG. 5 is a schematic of another exemplary fracturable logic element.

With reference to FIG. 5, a fourth exemplary embodiment of logic element 200 is depicted. The fourth exemplary embodiment of logic element 200 includes the features of the third exemplary embodiment with the addition of multiplexers 302, 304 to reduce the number of output lines from three to two, which reduces the number of drivers needed. As depicted in FIG. 5, multiplexers 302, 304 are each connected to output lines 232, 234, and 256. Thus, outputs on output lines 306, 308 from multiplexers 302, 304, respectively, can be selected among output lines 232, 234, and 256.

Figure 6:
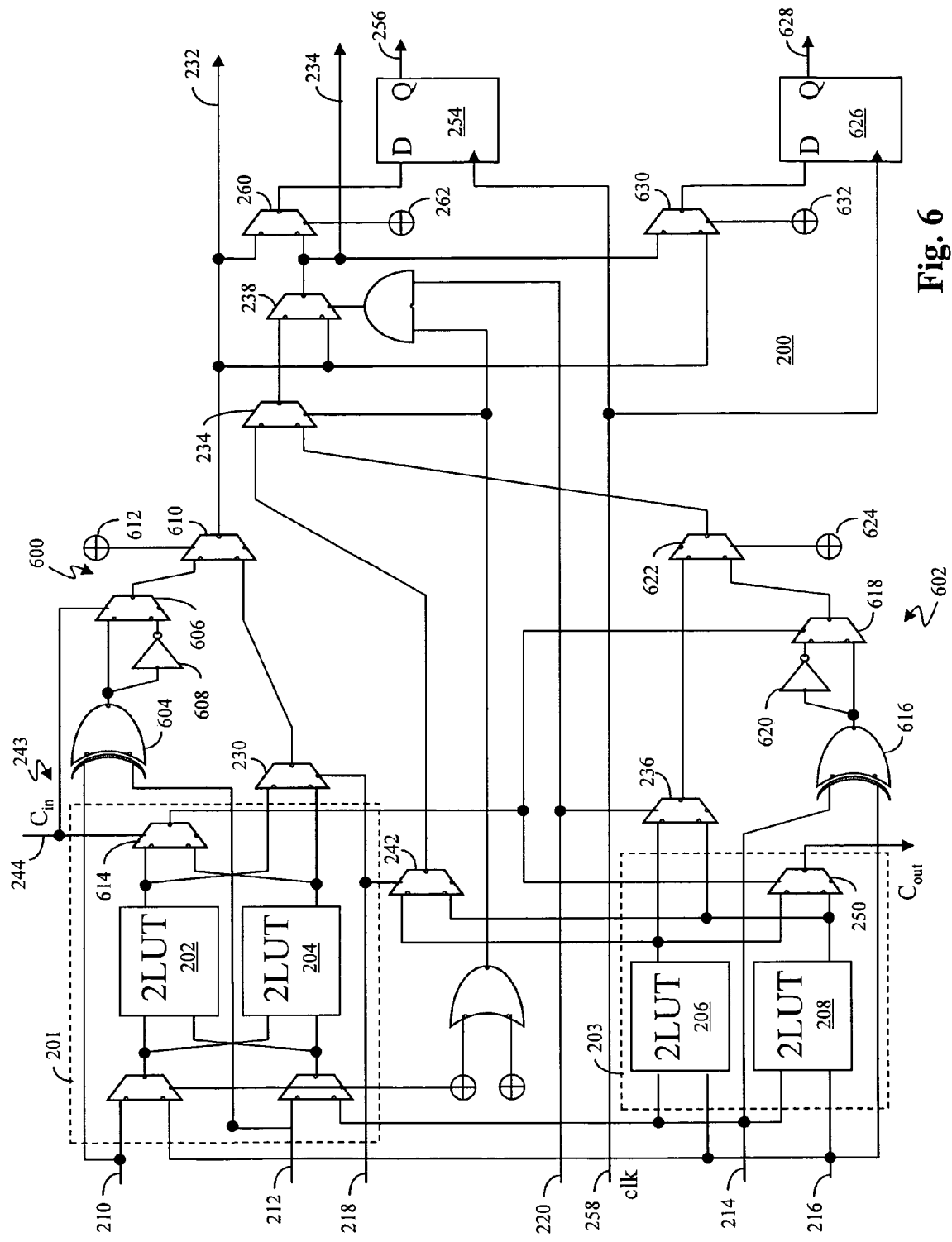
FIG. 6 is a schematic of another exemplary fracturable logic element.

With reference to FIG. 6, a fifth exemplary embodiment of logic element 200 is depicted. The fifth exemplary embodiment of logic element 200 includes the features of the third exemplary embodiment but with arithmetic circuit 243 comprised of adder circuits 600, 602 to implement two-bits of arithmetic. The fifth exemplary embodiment of logic element 200 also includes a second flip-flop 626 and a fourth output line 628.

Adder circuit 600 includes an exclusive OR (XOR) 604 with inputs connected to inputs 210, 212. The inputs of multiplexer 606 receive the output of XOR 604 and an inverse of the output of XOR 604 through inverter 608. The control input of multiplexer 606 is connected to carry-chain input 244. Thus, in an arithmetic mode, multiplexer 606 can produce an arithmetic sum based on inputs 210, 212 and carry-chain input 244. The inputs of multiplexer 610 are connected to the outputs of multiplexer 606 and multiplexer 230. The control input of multiplexer 610 is connected to a control bit 612. Thus, control bit 612 controls multiplexer 610 to select between the sum produced by multiplexer 606 and the output of multiplexer 230.

Adder circuit 602 includes an XOR 616 with inputs connected to inputs 214, 216. The inputs of multiplexer 618 receive the output of XOR 616 and an inverse of the output of XOR 616 through inverter 620. Thus, in an arithmetic mode, multiplexer 618 can produce an arithmetic sum based on inputs 214, 216. The inputs of multiplexer 622 are connected to the outputs of multiplexer 618 and multiplexer 236. The control input of multiplexer 622 is connected to a control bit 624. Thus, control bit 624 controls multiplexer 622 to select between the sum produced by multiplexer 618 and the output of multiplexer 236.

In the present exemplary embodiment, logic element 200 includes second flip-flop 626 to produce a second registered output on output line 628. As depicted in FIG. 6, flip-flop 626 receives clock signal 258, and the data input of flip-flop 626 is connected to the output of multiplexer 630. A control bit 632 controls multiplexer 630 to select between the outputs of multiplexer 610 and multiplexer 238.

Figure 7:
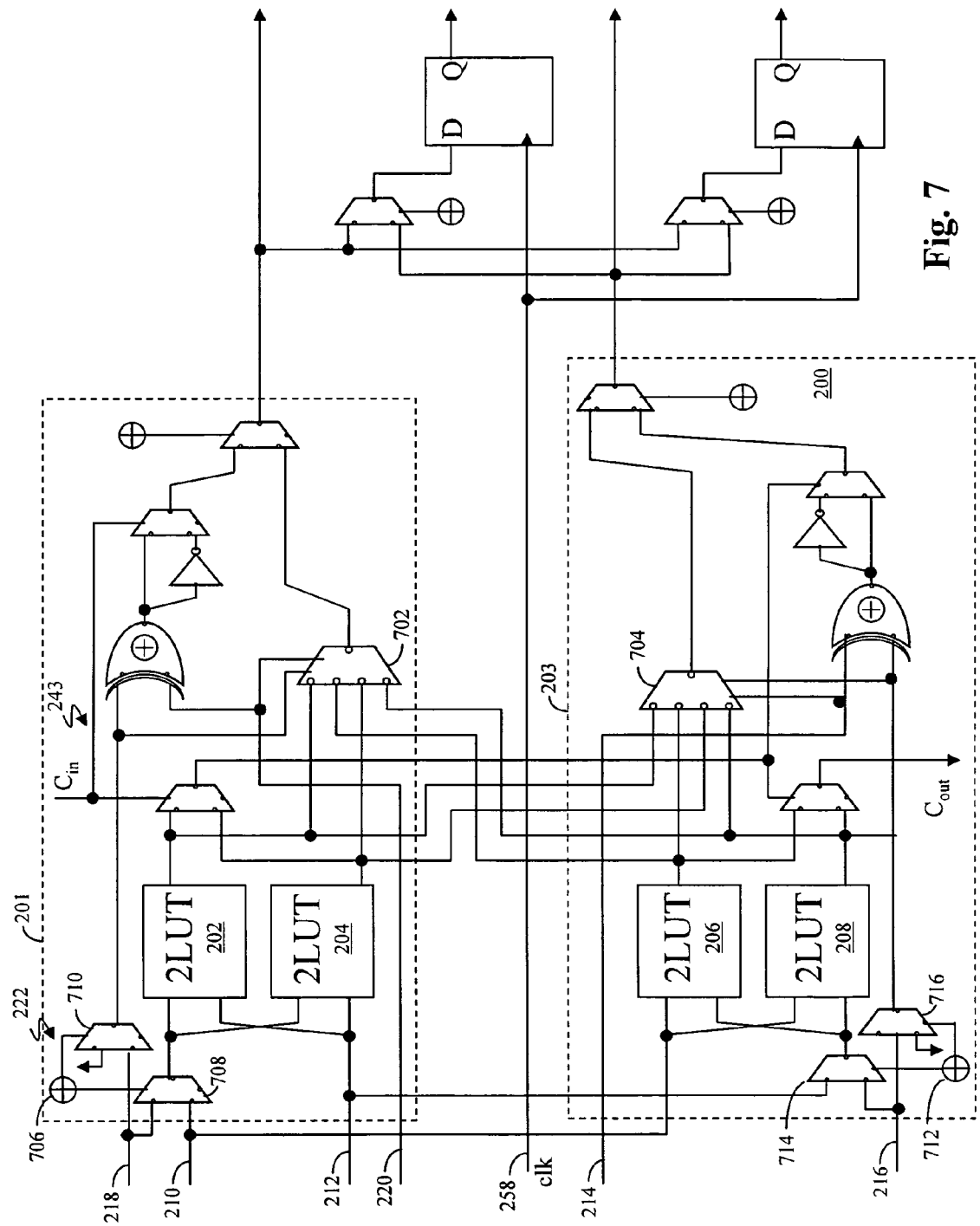
FIG. 7 is a schematic of another exemplary fracturable logic element.

With reference to FIG. 7, a sixth exemplary embodiment of logic element 200 is depicted. In the present exemplary embodiment, logic element 200 can be configured to perform two four-input logic functions sharing the logic elements/LUT masks of 2-LUTs 202, 204, 206, and 208.

As depicted in FIG. 7, in the present exemplary embodiment, a first 4:1 multiplexer 702 receives an input from each 2-LUT 202, 204, 206, and 208. A second 4:1 multiplexer 704 also receives an input from each 2-LUT 202, 204, 206, and 208. Control circuit 222 includes a control bit 706 connected to control inputs of multiplexers 708, 710. Inputs 210, 218 are connected to the inputs of multiplexer 708. The output of multiplexer 708 is connected to the inputs of 2-LUTs 202, 204. The outputs of 2-LUTs 202, 204 are connected to 4:1 multiplexers 702, 704. Input 218 is also connected to an input of multiplexer 710. The output of multiplexer 710 is connected to a control input of 4:1 multiplexer 702. Input 220 is connected to another control input of 4:1 multiplexer 702.

Control circuit 222 also includes a control bit 712 connected to control inputs of multiplexers 714, 716. Inputs 212, 216 are connected to the inputs of multiplexer 714. The output of multiplexer 714 is connected to the inputs of 2-LUTs 206, 208. The outputs of 2-LUTs 206, 208 are connected to 4:1 multiplexers 702, 704. Input 216 is connected to a control input of 4:1 multiplexer 704. Input 214 is connected to another control input of 4:1 multiplexer 704.

When control circuit 222 operates in a first mode, control bit 706 controls multiplexer 708 to select input 210 as the output of multiplexer 708 rather than input 218. Control bit 712 controls multiplexer 714 to select input 212 as the output of multiplexer 714. Thus, inputs 210, 212 are used as inputs of 2-LUTs 206, 208 as well as 2-LUTs 202, 204. Control bit 706 controls multiplexer 710 to select input 218 as the output of multiplexer 710. Thus, 4:1 multiplexer 702 is controlled by inputs 218, 220, and the output of 4:1 multiplexer 702 is the combinatorial output of the four inputs 210, 212, 218, and 220. Additionally, control bit 712 controls multiplexer 716 to select input 216 as the output of multiplexer 716. Thus, 4:1 multiplexer 702 is controlled by inputs 214, 216, and the output of 4:1 multiplexer 704 is the combinatorial output of the four inputs 210, 212, 214, and 216.

When control circuit 222 operates in a second mode, control bit 706 controls multiplexer 708 to select input 218 as the output of multiplexer 708 rather than input 210. Thus, inputs 212, 218 are used as inputs of 2-LUTs 202, 204. Input 220 controls 4:1 multiplexer 702. Thus, the output of 4:1 multiplexer 702 is the combinatorial output of the three inputs 212, 218, and 220.

Additionally, when control circuit 222 operates in the second mode, control bit 712 control multiplexer 714 to select input 216 as the output of multiplexer 714. Thus, inputs 210, 216 are used as inputs of 2-LUTs 206, 208. Input 214 controls 4:1 multiplexer 704. Thus, the output of 4:1 multiplexer 704 is the combinatorial output of the three inputs 210, 214, and 216.

Figure 8:
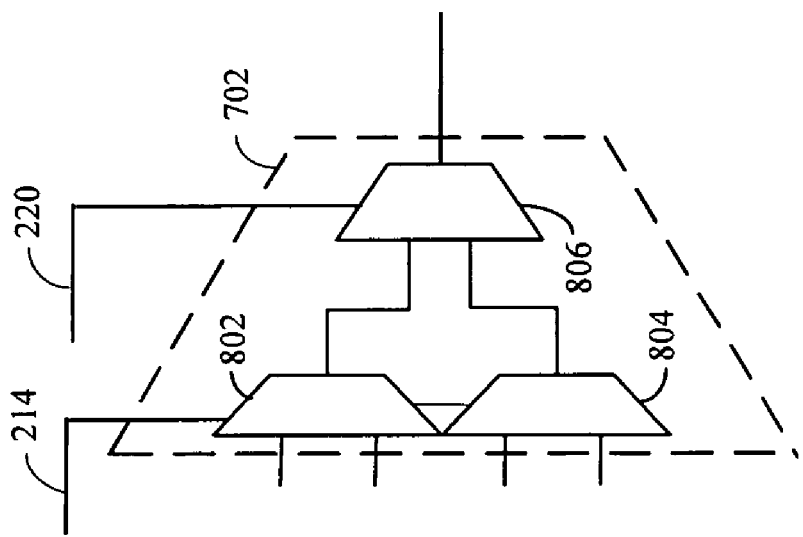
FIG. 8 is a schematic of an exemplary 4:1 multiplexer implemented as a tree of 2:1 multiplexers.

It should be recognized that each 4:1 multiplexer 702, 704 can be implemented as a tree of multiple 2:1 multiplexers. For example, with reference to FIG. 8, 4:1 multiplexer 702 can be implemented as a tree of three 2:1 multiplexers 802, 804, 806. The inputs of multiplexer 802 are connected to the outputs of 2-LUT 202 (FIG. 7) and 2-LUT 206 (FIG. 7), respectively. The inputs of multiplexer 804 are connected to the outputs of 2-LUT 204 (FIG. 7) and 2-LUT 208 (FIG. 7), respectively. The control inputs of multiplexers 802, 804 are connected to input 218. The outputs of multiplexers 802, 804 are connected to the inputs of multiplexer 806. The control input of multiplexer 806 is connected to input 220.

For additional descriptions of shared LUT masks, see U.S. patent application Ser. No. 10/810,117, titled OMNIBUS LOGIC ELEMENT, filed on Mar. 25, 2004, which is incorporated herein by reference in its entirety, and U.S. patent application Ser. No. 10/351,026, titled LOGIC CIRCUITRY WITH SHARED LOOKUP TABLE, filed on Jan. 24, 2003, which is incorporated herein by reference in its entirety.

Figure 9:
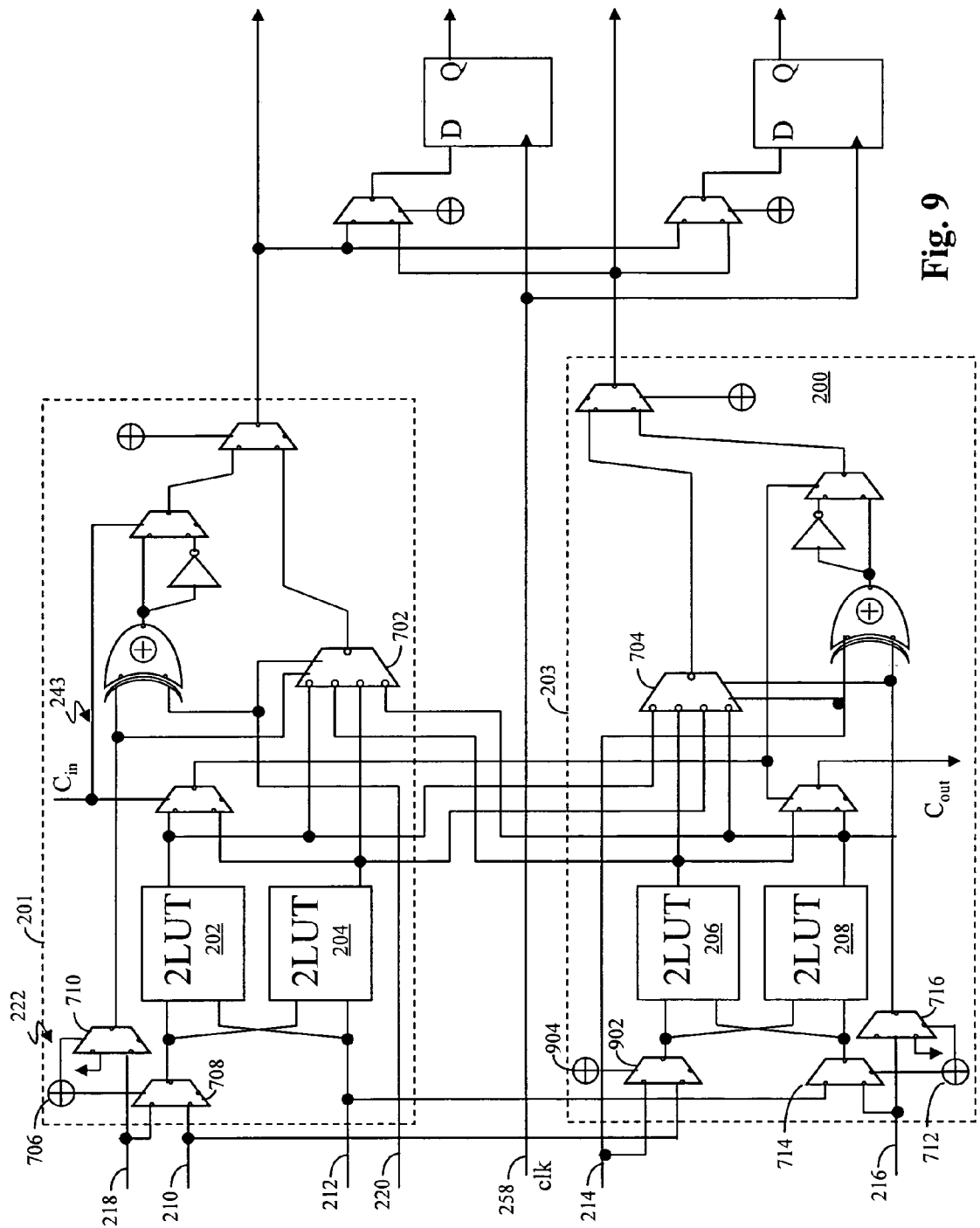
FIG. 9 is a schematic of another exemplary fracturable logic element.

With reference to FIG. 9, a seventh exemplary embodiment of logic element 200 is depicted. The seventh exemplary embodiment of logic element 200 includes the features of the sixth exemplary embodiment with the addition of multiplexer 902 to implement a 4:1 multiplexing mode. As depicted in FIG. 9, multiplexer 902 selects between inputs 210, 214 under the control of a control bit 904.

To operate in the 4:1 multiplexing mode, control bit 706 controls multiplexer 708 to select input 210. Control bit 904 controls multiplexer 902 to select input 214. Control bit 712 controls multiplexer 714 to select input 216. Thus, inputs 210, 212, 214, and 216 are used as inputs to 4:1 multiplexer 702. Inputs 218, 220 control 4:1 multiplexer 702.

Figure 10:
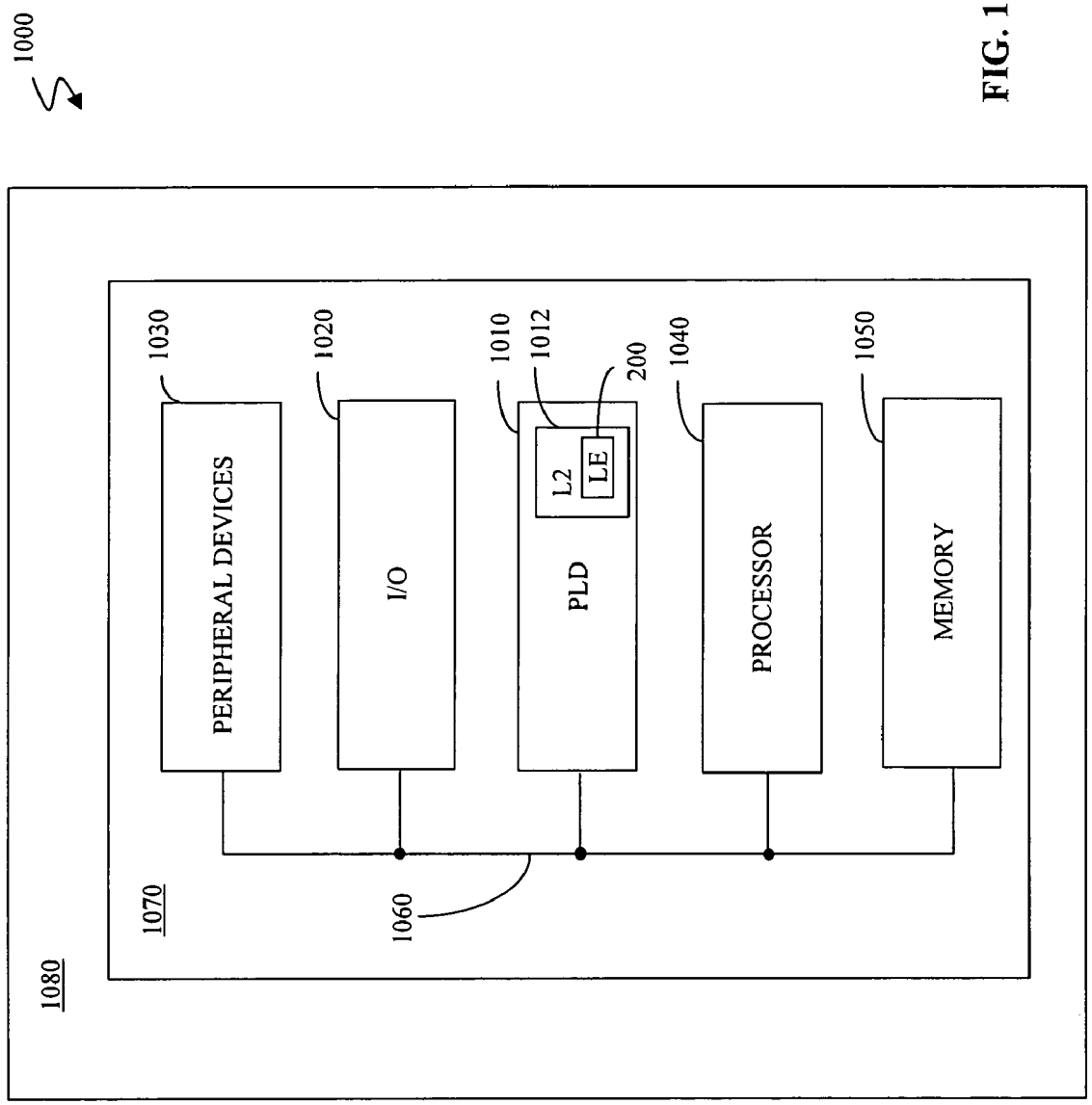
FIG. 10 is a block diagram of an exemplary data processing system.

With reference to FIG. 10, an exemplary data processing system 1000 is depicted. Data processing system 1000 includes a PLD 1010 that may include embodiments of logic element 200 as discussed above. PLD 1010 includes a plurality of logic array blocks (LABs), such as the illustrated LAB 1012. (Only one LAB is shown to avoid overcomplicating the drawing.) LAB 1012 includes a plurality of logic elements such as the illustrated logic element 200. (Only one logic element is shown to avoid overcomplicating the drawing.) Data processing system 1000 may include one or more of the following components: a processor 1040; memory 1050; I/O circuitry 1020; and peripheral devices 1030. These components are coupled together by a system bus 1060 and are populated on a circuit board 1070 which is contained in an end-user system 1080.

Data processing system 1000 can be used in a wide variety of applications, such as computer networking, data networking, instrumentation, video processing, digital signal processing, or any other application where the advantage of using programmable or reprogrammable logic is desirable. PLD 1010 can be used to perform a variety of different logic functions. For example, PLD 1010 can be configured as a processor or controller that works in cooperation with processor 1040 (or, in alternative embodiments, a PLD might itself act as the sole system processor). PLD 1010 may also be used as an arbiter for arbitrating access to shared resources in system 1000. In yet another example, PLD 1010 can be configured as an interface between the processor 1040 and one of the other components in system 1000. It should be noted that system 1000 is only exemplary.

Although various exemplary embodiments have been described, it will be appreciated that various modifications and alterations may be made by those skilled in the art.

What is claimed is:

1. A fracturable logic element comprising:
a first, second, third, and fourth two-input lookup tables (2-LUTs), wherein each 2-LUT includes four memory elements, each memory element configured to hold one data bit;
a set of six inputs; and
a control circuit configured to operate in a first mode and a second mode,
wherein, when the control circuit operates in the first mode, a first combinatorial output is generated using four of the set of six inputs and the first, second, third, and fourth 2-LUTs,
wherein, when the control circuit operates in the second mode, a second combinatorial output is generated using a first subset of three of the set of six inputs and the first and second 2-LUTS, and
wherein, when the control circuit operates in the second mode, a third combinatorial output is generated using a second subset of three of the set of six inputs and the third and fourth 2-LUTs, the first and second subsets being non-intersecting subsets of the set of six inputs.

2. The fracturable logic element of claim 1, further comprising:
a first multiplexer with inputs connected to the first and fourth inputs of the set of six inputs and an output connected to the first and second 2-LUTs;
a second multiplexer with inputs connected to the second and third inputs of the set of six inputs and an output connected to the first and second 2-LUTs,
wherein the control circuit is connected to the control inputs of the first and second multiplexers,
wherein, when the control circuit operates in the first mode, the first and second multiplexers select the fourth and third inputs as outputs from the first and second multiplexers to the first and second 2-LUTs, and
wherein, when the control circuit operates in the second mode, the first and second multiplexers select the first and second inputs as outputs from the first and second multiplexers to the first and second 2-LUTs.

3. The fracturable logic element of claim 2, further comprising:
a hierarchy of multiplexers connected to the first, second, third, and fourth 2-LUTs, wherein, when the control circuit operates in the second mode, the first, second, third, and fourth inputs are multiplexed by the hierarchy of multiplexers with the fifth and sixth inputs of the set of six inputs used as control inputs for the hierarchy of multiplexers.

4. The fracturable logic element of claim 3, wherein the hierarchy of multiplexers includes:
a third multiplexer with inputs connected to the first and second 2-LUTs and a control input connected to the fifth input;
a fourth multiplexer with inputs connected to the third and fourth 2-LUTs and a control input connected to the fifth input; and
a fifth multiplexer with inputs connected to the third and fourth multiplexers and a control input connected to the sixth input.

5. The fracturable logic element of claim 4, further comprising:
a sixth multiplexer with inputs connected to the third and fourth 2-LUTs and a control input connected to the sixth input;
a seventh multiplexer connected between the fourth and fifth multiplexers with inputs connected to the fourth and sixth multiplexers;
a first logic gate connected to the control input of the seventh multiplexer; and
a second logic gate connected to the control input of the fifth multiplexer with inputs connected to the first logic gate and the sixth input.

6. The fracturable logic element of claim 1, further comprising:
an arithmetic circuit having a carry-chain input connected to a previous logic element and a carry-chain output connected to a subsequent logic element, wherein the arithmetic circuit is configured to produce an arithmetic sum based on outputs from the first and second 2-LUTs and the carry-chain input.

7. The fracturable logic element of claim 1, further comprising:

a first adder circuit connected to a carry-chain input and the first and fourth inputs of the set of six inputs, wherein the first adder circuit generates an arithmetic sum based on the carry-chain input and the first and fourth inputs of the set of six inputs; and a second adder circuit connected to the third and fourth inputs of the set of six inputs, wherein the second adder circuit generates an arithmetic sum based on the third and fourth inputs of the set of six inputs.

8. The fracturable logic element of claim 1, further comprising:
a flip-flop connected to the outputs of the first, second, third, and fourth 2-LUTs to generate a first registered output using four of the set of six inputs or a second registered output using the first subset of three of the set of six inputs.

9. The fracturable logic element of claim 8, further comprising:
a first output line connected to the outputs of the first and second 2-LUTs;
a second output line connected to the outputs of the first, second, third, and fourth 2-LUTs;
a third output line connected to the flip-flop;
a first multiplexer with inputs connected to the first, second, and third output lines; and
a second multiplexer with inputs connected to the first, second, and third output lines.

10. The fracturable logic element of claim 1, further comprising:
a first 4:1 multiplexer with inputs connected to the first, second, third, and fourth 2-LUTs; and
a second 4:1 multiplexer with inputs connected to the first, second, third, and fourth 2-LUTs.

11. The fracturable logic element of claim 10, further comprising:
a first multiplexer with inputs connected to the fifth and first inputs of the set of six inputs and an output connected to the first and second 2-LUTs; and
a second multiplexer with inputs connected to second and fourth inputs of the set of six inputs and an output connected to the third and fourth 2-LUTs,
wherein, when the control circuit operates in the first mode, the first 4:1 multiplexer generates the first combinatorial output of the first, second, fifth, and sixth inputs of the set of six inputs and the second 4:1 multiplexer generates the first combinatorial output of the first, second, third, and fourth inputs of the set of six inputs, and
wherein, when the control circuit operates in the second mode, the first 4:1 multiplexer generates the second combinatorial output of the second, fifth, and sixth inputs of the set of six inputs and the second 4:1 multiplexer generates the third combinatorial output of the first, third, and fourth inputs of the set of six inputs.

12. The fracturable logic element of claim 11, further comprising:
a third multiplexer with inputs connected to the first and third inputs, wherein, when the first multiplexer outputs the first input of the set of six inputs to the first 2-LUT and the second multiplexer outputs the fourth input of the set of six inputs to the fourth 2-LUT and the third multiplexer outputs the third input of the set of six inputs to the third 2-LUT, the first 4:1 multiplexer multiplexes the first, second, third, and fourth inputs with the fifth and sixth inputs used as control inputs for the first 4:1 multiplexer.

13. The fracturable logic element of claim 10, wherein the first 4:1 multiplexer is a tree of 2:1 multiplexers.

14. A programmable logic device, comprising:
a logic element according to claim 1.

15. A data processing system, comprising:
a programmable logic device according to claim 13.

16. A fracturable logic element comprising:
a first, second, third, and fourth two-input lookup tables (2-LUTs), wherein each 2-LUT includes four memory elements, each memory element configured to hold one data bit;
a set of six inputs;
a set of multiplexers with inputs connected to four of the set of six inputs with outputs connected to at least two of the first, second, third, and fourth 2-LUTs; and
a control circuit connected to the set of multiplexers and configured to operate in a first mode and a second mode,
wherein, when the control circuit operates in the first mode, a first combinatorial output is generated using four of the set of six inputs and the first, second, third, and fourth 2-LUTs,
wherein, when the control circuit operates in the second mode, a second combinatorial output is generated using a first subset of three of the set of six inputs and the first and second 2-LUTS, and
wherein, when the control circuit operates in the second mode, a third combinatorial output is generated using a second subset of three of the set of six inputs and the third and fourth 2-LUTs, the first and second subsets being non-intersecting subsets of the set of six inputs.

17. The fracturable logic element of claim 16, wherein the set of multiplexers comprises:
a first multiplexer with inputs connected to the first and fourth inputs of the set of six inputs and an output connected to the first and second 2-LUTs;
a second multiplexer with inputs connected to the second and third inputs of the set of six inputs and an output connected to the first and second 2-LUTs,
wherein the control circuit is connected to the control inputs of the first and second multiplexers,
wherein, when the control circuit operates in the first mode, the first and second multiplexers select the fourth and third inputs as outputs from the first and second multiplexers to the first and second 2-LUTs, and
wherein, when the control circuit operates in the second mode, the first and second multiplexers select the first and second inputs as outputs from the first and second multiplexers to the first and second 2-LUTs.

18. The fracturable logic element of claim 16, wherein the set of multiplexers comprises:
a first multiplexer with inputs connected to the fifth and first inputs of the set of six inputs and an output connected to the first and second 2-LUTs; and
a second multiplexer with inputs connected to second and fourth inputs of the set of six inputs and an output connected to the third and fourth 2-LUTs,
wherein the control circuit is connected to the control inputs of the first and second multiplexers,
wherein, when the control circuit operates in the first mode, the first and second multiplexers select first and second inputs as outputs from the first and second multiplexers, and
wherein, when the control circuit operates in the second mode, the first and second multiplexers select the fifth and fourth inputs as outputs from the first and second multiplexers.

19. The fracturable logic element of claim 18, further comprising:
a first 4:1 multiplexer with inputs connected to the first, second, third, and fourth 2-LUTs; and
a second 4:1 multiplexer with inputs connected to the first, second, third, and fourth 2-LUTs
wherein, when the control circuit operates in the first mode, the first 4:1 multiplexer generates the first combinatorial output of the first, second, fifth, and sixth inputs of the set of six inputs and the second 4:1 multiplexer generates the first combinatorial output of the first, second, third, and fourth inputs of the set of six inputs, and
wherein, when the control circuit operates in the second mode, the first 4:1 multiplexer generates the second combinatorial output of the second, fifth, and sixth inputs of the set of six inputs and the second 4:1 multiplexer generates the third combinatorial output of the first, third, and fourth inputs of the set of six inputs.

20. A method of making a fracturable logic element, comprising:
forming a first, second, third, and fourth two-input lookup tables (2-LUTs), wherein each 2-LUT includes four memory elements, each memory element configured to hold one data bit;
forming a set of six input lines; and
forming a control circuit configured to operate in a first mode and a second mode,
wherein, when the control circuit operates in the first mode, a first combinatorial output is generated using four of the set of six input lines and the first, second, third, and fourth 2-LUTs,
wherein, when the control circuit operates in the second mode, a second combinatorial output is generated using a first subset of three of the set of six input lines and the first and second 2-LUTS, and
wherein, when the control circuit operates in the second mode, a third combinatorial output is generated using a second subset of three of the set of six input lines and the third and fourth 2-LUTs, the first and second subsets being non-intersecting subsets of the set of six input lines.

21. The method of claim 20, further comprising:
connecting inputs of a first multiplexer to the first and fourth input lines of the set of six input lines;
connecting an output of the first multiplexer to the first and second 2-LUTs;
connecting inputs of a second multiplexer to the second and third input lines of the set of six input lines;
connecting an output of the second multiplexer to the first and second 2-LUTs; and
connecting the control circuit to the control inputs of the first and second multiplexers,
wherein, when the control circuit operates in the first mode, the first and second multiplexers select the fourth and third input lines, and
wherein, when the control circuit operates in the second mode, the first and second multiplexers select the first and second input lines.

22. The method of claim 20, further comprising:
connecting inputs of a first multiplexer to the fifth and first input lines of the set of six input lines;
connecting an output of the first multiplexer to the first and second 2-LUTs;
connecting inputs of a second multiplexer to the second and fourth input lines of the set of six input lines;
connecting an output of the second multiplexer to the third and fourth 2-LUTs; and
connecting the control circuit to the control inputs of the first and second multiplexers,
wherein, when the control circuit operates in the first mode, the first and second multiplexers select the first and second input lines, and
wherein, when the control circuit operates in the second mode, the first and second multiplexers select the fifth and fourth input lines.

23. The method of claim 22, further comprising:
connecting inputs of a first 4:1 multiplexer to the first, second, third, and fourth 2-LUTs; and
connecting inputs of a second 4:1 multiplexer to the first, second, third, and fourth 2-LUTs,
wherein, when the control circuit operates in the first mode, the first and second 4:1 multiplexers generate the first combinatorial output, and
wherein, when the control circuit operates in the second mode, the first 4:1 multiplexer generates the second combinatorial output and the second 4:1 multiplexer generates the third combinatorial output.

* * * * *